(12) United States Patent
Di et al.

(10) Patent No.: US 11,095,287 B1
(45) Date of Patent: Aug. 17, 2021

(54) ASYNCHRONOUS POLYMORPHIC LOGIC GATE DESIGN

(71) Applicants: Jia Di, Fayetteville, AR (US); Chandler Bernard, Fayetteville, AR (US)

(72) Inventors: Jia Di, Fayetteville, AR (US); Chandler Bernard, Fayetteville, AR (US)

(*) Notice: Subject to any disclaimer, the term of this patent is extended or adjusted under 35 U.S.C. 154(b) by 0 days.

(21) Appl. No.: 16/937,670

(22) Filed: Jul. 24, 2020

Related U.S. Application Data

(60) Provisional application No. 62/880,899, filed on Jul. 31, 2019.

(51) Int. Cl.
| | | |
|---|---|---|
| *H03K 19/00* | (2006.01) | |
| *H03K 19/0185* | (2006.01) | |
| *H03K 19/21* | (2006.01) | |
| *H03K 19/0944* | (2006.01) | |

(52) U.S. Cl.
CPC ..... *H03K 19/0027* (2013.01); *H03K 19/0185* (2013.01); *H03K 19/0944* (2013.01); *H03K 19/215* (2013.01)

(58) Field of Classification Search
CPC .......... H03K 19/0027; H03K 19/0185; H03K 19/215; H03K 19/0944; H03K 19/01707
See application file for complete search history.

(56) References Cited

U.S. PATENT DOCUMENTS

| | | | | |
|---|---|---|---|---|
| 4,800,303 | A * | 1/1989 | Graham | H03K 19/018535 326/30 |
| 6,288,599 | B1 * | 9/2001 | Coddington | H03K 19/0027 327/530 |
| 9,083,337 | B2 * | 7/2015 | Smith | H03K 19/0016 |
| 2013/0181740 | A1 * | 7/2013 | Smith | H03K 19/0963 326/46 |
| 2019/0278359 | A1 * | 9/2019 | Kim | H03K 19/0027 |

OTHER PUBLICATIONS

P. Kocher, J. Jaffe, and B. Jun "Differential Power Analysis," Springer-Verlag, LNCS 1666, pp. 388-397, Cryto'99, 1999.
P. Kocher, "Timing Attacks on Implementations of Diffie-Hellman, RSA, DSS, and Other Systems," 16th Annual International Cryptology Conference on Advances in Cryptology, 1996, pp. 104-113.
E. Mulder, S. Ors, B. Preneel, and I. Verbauwhede, "Differential Electromagnetic on an FPGA Implementation of Elliptic Curve Cryptosystems," WAC 2006, pp. 1-6.
E. Biham and A. Shamir, "Differential Fault Analysis of Secret Key Cryptosystems," 17th Annual International Cryptology Conference on Advances in Cryptology, 1997, 513-525.
M. Tehranipoor and F. Koushanfar. A Survey of Hardware Trojan Taxonomy and Detection. In Design & Test. IEEE, vol. PP, pp. 1-1, 2013.

(Continued)

*Primary Examiner* — Daniel D Chang
(74) *Attorney, Agent, or Firm* — Keisling & Pieper PLC; David B. Pieper; Trent C. Keisling

(57) ABSTRACT

Multiple polymorphic Multi-Threshold NULL Convention Logic gates that exhibit one function under a higher supply voltage, and the other function under a lower supply voltage and asynchronous polymorphic circuits able to implement two distinctive functionalities controlled by the supply voltage.

8 Claims, 7 Drawing Sheets

(56) References Cited

OTHER PUBLICATIONS

R. Torrance and D. James, "The State-of-the-Art in IC Reverse Engineering," Chipworks Inc., https://www.iacr.org/archive/ches2009/57470361/57470361.pdf.
J. Zheng and A. S. Namin, "A Survey on the Moving Target Defense Strategies: an Architectural Perspective," Journal of Computer Science and Technology, vol. 34, Issue 1, pp. 207-233, Jan. 2019.
A. Stoica, R. Zebulum, and D. Keymeulen, "Polymorphic Electronics," 2001 International Conference on Evolvable Systems.
R. Ruzicka and V. Simek, "NAND/NOR gate polymorphism in low temperature environment," 2012 IEEE 15th international Symposium on Design and Diagnostics of Electronic Circuits and Systems.
K. M. Fant and S. A. Brandt, "NULL Convention Logic: A Complete and Consistent Logic for Asynchronous Digital Circuit Synthesis," International Conference on Application Specific Systems, Architectures, and Processors, 1996.
S. C. Smith and J. Di, Designing Asynchronous Circuits using NULL Convention Logic (NCL), Morgan & Claypool Publishers, 2009.

\* cited by examiner

ASYNCHRONOUS POLYMORPHIC LOGIC GATE DESIGN

CROSS-REFERENCE TO RELATED APPLICATIONS

This application claims priority to and is a continuation-in-part of U.S. Patent Application Ser. No. 62/880,899, filed on Jul. 31, 2019 entitled ASYNCHRONOUS POLYMORPHIC LOGIC GATE DESIGN which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in electrical logic circuits. More particularly, the invention relates to improvements particularly suited for providing multiple polymorphic Multi-Threshold NULL Convention Logic gates that exhibit one function under a higher supply voltage, and the other function under a lower supply voltage and asynchronous polymorphic circuits able to implement two distinctive functionalities controlled by the supply voltage.

2. Description of the Known Art

As will be appreciated by those skilled in the art, electrical circuits are known in various forms. Papers and articles relevant to the present subject matter include:
1. P. Kocher, J. Jaffe, and B. Jun "Differential Power Analysis," Springer-Verlag, LNCS 1666, pp. 388-397, Cryto'99, 1999
2. P. Kocher, "Timing Attacks on Implementations of Diffie-Hellman, RSA, DSS, and Other Systems," 16th Annual International Cryptology Conference on Advances in Cryptology, 1996, pp. 104-113
3. E. Mulder, S. Ors, B. Preneel, and I. Verbauwhede, "Differential Electromagnetic Attack on an FPGA Implementation of Elliptic Curve Cryptosystems," WAC 2006, pp. 1-6
4. E. Biham and A Shamir, "Differential Fault Analysis of Secret Key Cryptosystems," 17th Annual International Cryptology Conference on Advances in Cryptology, 1997, pp. 513-525
5. M. Tehranipoor and F. Koushanfar. A Survey of Hardware Trojan Taxonomy and Detection. In Design & Test. IEEE, vol. PP, pp. 1-1, 2013
6. R. Torrance and D. James, "The State-of-the-Art in IC Reverse Engineering," Chipworks Inc., https://www.iacr.org/archive/ches2009/57470361/57470361.pdf
7. J. Zheng and A. S. Namin, "A Survey on the Moving Target Defense Strategies: an Architectural Perspective," Journal of Computer Science and Technology, Vol. 34, Issue 1, pp. 207-233, January 2019
8. A. Stoica, R. Zebulum, and D. Keymeulen, "Polymorphic Electronics," 2001 International Conference on Evolvable Systems
9. R. Ruzicka and V. Simek, "NAND/NOR gate polymorphism in low temperature environment," 2012 IEEE 15th international Symposium on Design and Diagnostics of Electronic Circuits and Systems
10. K. M. Fant and S. A. Brandt, "NULL Convention Logic: A Complete and Consistent Logic for Asynchronous Digital Circuit Synthesis," International Conference on Application Specific Systems, Architectures, and Processors, 1996.
11. S. C. Smith and J. Di, Designing Asynchronous Circuits using NULL Convention Logic (NCL), Morgan & Claypool Publishers, 2009.

Digital integrated circuits (ICs) can be classified into two major categories, application-specific IC (ASIC) and field programmable gate array (FPGA). ASICs are specifically designed for a small set of applications, whose circuit structures are fixed after fabrication. On the other hand, FPGAs can be reprogrammed into any digital logic even after they are employed in the target systems. Therefore, there are clear tradeoffs between these two: ASICs offer the fastest speed, lowest power consumption, smallest area, and lower cost (in mass production) for their specific applications without any flexibility, while FPGAs are very flexible and can be applied to a large variety of applications with reduced speed, higher power consumption, larger area, and higher cost.

As technologies advance, emerging applications from both commercial and government sides demand new capabilities in digital ICs beyond the abovementioned tradeoffs. One such application is hardware security. Although the prevailing cryptographic algorithms are mathematically strong and cannot be cracked in a brute force manner within a reasonable amount of time, their hardware implementations are much easier to break. Side-channel attacks [1-4], hardware Trojan insertion [5], and reverse engineering [6] are among the common threats to hardware cryptographic modules. For ASIC implementations of these modules, since the circuits themselves cannot be changed, attackers have all the time they need to carry out the attacks. FPGAs can be reprogrammed periodically to change the internal circuit structure in mitigating some attacks similar to the moving target defense in network security [7]; however, compared to ASICs, FPGAs have a set of additional threats due to such reconfigurability—the internal logic is programmed through bitstream, a software file that needs to be loaded into the FPGA upon each time it is powered on, thereby creating opportunities for attackers to intercept, read back, modify, and disrupt the bitstream and in turn compromise the FPGA functionality. Therefore, it will be ideal if the hardware implementation has some flexibility but without the need of software loading. Another such application is adaptive systems. These systems can autonomously adjust their operation based on certain conditions, without external control. For example, for portable battery-powered electronic devices, if the battery is about to deplete, it would be ideal if the device is able to switch to lower-performance, low-power mode autonomously. Another example is temperature. Since electronic devices become slower and consume more leakage power when temperature increases, it would be beneficial if the device can autonomously reduce its switching activity in order to bring the temperature down, and adjust its timing control to accommodate the longer delay. While ASICs do not have the flexibility required unless incorporating circuits of all functions on the chip, which will degrade all their performance metrics and defeat the purpose of using ASICs, FPGAs are not suitable for these applications either due to their high power consumption and high cost.

In order to address such needs, the concept of polymorphic circuits was first discussed by NASA JPL in 2001 [8]. Polymorphic circuits are special circuit designs where a fixed CMOS digital circuit may carry out two or more different functions based on changes in operating conditions or control, e.g., supply voltage, temperature, and external control bit. For example, a polymorphic circuit may function as an AES cryptographic engine at 1.2V supply voltage but will switch to a SHA cryptographic engine when the supply voltage changes to 0.7V. Since these functions are embedded into the logic gate designs, the area is much smaller compared to if all functions are standalone due to the sharing of transistors inside each gate. In other words, polymorphic circuits are essentially ASICs with certain reconfigurability. They possess the advantages of both ASICs (e.g., high speed, low power, small area, low cost, and secure) and FPGAs (e.g., flexibility) while avoiding/alleviating their drawbacks.

However, the development of polymorphic circuits has been very slow, if not halted, in the past years. Only individual gates have been reported in fabricated hardware [9] and no meaningful circuits have ever been demonstrated beyond software simulations. The major reason is the difficulty in reaching timing closure. For the prevailing clocked synchronous digital circuits, ensuring all circuit components meeting the timing requirements in the specification (i.e., reaching timing closure) is a very challenging task and requires the largest amount of design efforts. For polymorphic synchronous circuits, two or more functions under different conditions (e.g., supply voltage and temperature) make reaching timing closure extremely difficult. Therefore, a timing-robust design paradigm is needed for polymorphic circuits to become practical for commercial and government applications.

From these prior references and state of the art it may be seen that the prior art is very limited in its teaching and utilization, and an improved electrical circuit is needed to overcome these limitations.

SUMMARY OF THE INVENTION

The present invention is directed to an improved asynchronous polymorphic logic gate design allowing the same digital circuit to exhibit two distinctive functionalities reliably controlled by the supply voltage. Compared to implementing the two functionalities separately, the polymorphic design is much more efficient and provides unique advantages such as adaptivity and enhanced security.

This invention is a logic gate design methodology for incorporating the polymorphic circuit concept into a delay-insensitive asynchronous paradigm, more specifically, Multi-Threshold NULL Convention Logic (MTNCL), in order to create practical digital circuits with two distinctive functionalities controlled by the supply voltage, thereby enabling the practical use of such circuits in commercial and government applications. Leveraging the flexible timing requirement feature of MTNCL, asynchronous polymorphic circuits allow for robust circuit operation in different functionalities under different supply voltages, without any timing consideration in the design process.

The present invention is useful for:
1. Cryptographic modules, accelerators, and co-processors in any ICs;
2. Computational modules in battery-powered electronic devices;
3. Control modules in battery-powered electronic devices;
4. Any digital intellectual property (IP) that requires the incorporation of a watermark.

Advantages of the present invention include:

Enhanced security—with internal voltage changes, the same cryptographic circuit can switch between different cryptographic algorithms or different cryptographic keys. External attackers do not have any knowledge about such changes since the supply voltage is internal. Moreover, these circuits are highly resistant to side-channel attacks, hardware Trojan insertion, and reverse engineering;

Hidden watermarking—for intellectual property (IP) protection, the second functionality of a polymorphic circuit can be used as a watermark that is only known by the IP developer;

Adaptive to operating conditions—when circuit's operating conditions change (e.g., voltage supplied by energy harvesting circuitry), the polymorphic circuits autonomously adapt to such changes and adjust their functionalities to accommodate them.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

As shown in FIGS. 1 through 7 of the drawings, one exemplary embodiment of the present invention is directed to an electrical circuit with Asynchronous Polymorphic MTNCL Gates.

Asynchronous Logic and Multi-Threshold NULL Convention Logic (MTNCL).

Figure 1:
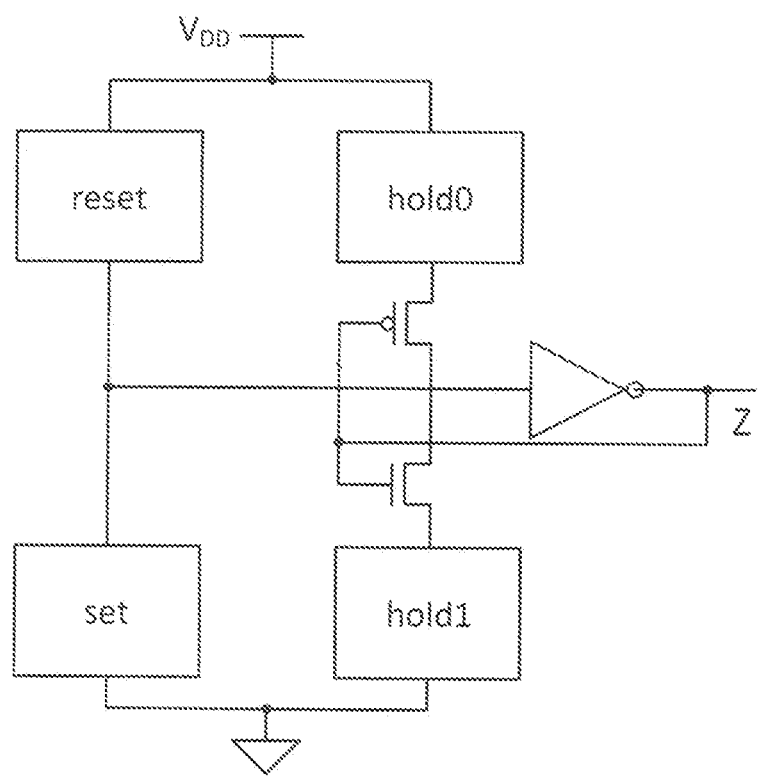
FIG. 1 is a NCL Gate General Diagram.

Asynchronous logic circuits do not have clock; instead, they use handshaking protocols to control the circuit behavior. Different from the bounded-delay counterpart in which gate delays are bounded and the circuit will malfunction if any gate delay exceeds the bound, quasi-delay-insensitive (QDI) style asynchronous circuits, such as the NULL Convention Logic (NCL) [10], do not assume delay bounds. Individual gate or wire delay has no impact on the correctness of the circuit's output. Since signal propagation is not time-dependent, NCL circuits require very little, if any, timing analysis. NCL circuits utilize multi-rail signals to achieve delay-insensitivity. The most prevalent multi-rail encoding scheme is dual-rail. NCL logic family consists of 27 threshold gates, each of which has four blocks to either change or hold the output, as shown in FIG. 1. NCL circuits communicate using request and acknowledge signals to prevent the current DATA from overwriting the previous DATA. With the recent resurgence of asynchronous logic (e.g., IBM TrueNorth neuromorphic processor has 60-70% QDI asynchronous logic), the multi-billion dollar semiconductor industry has been actively looking for asynchronous circuit design technologies to be adopted in commercial products.

Figure 2:
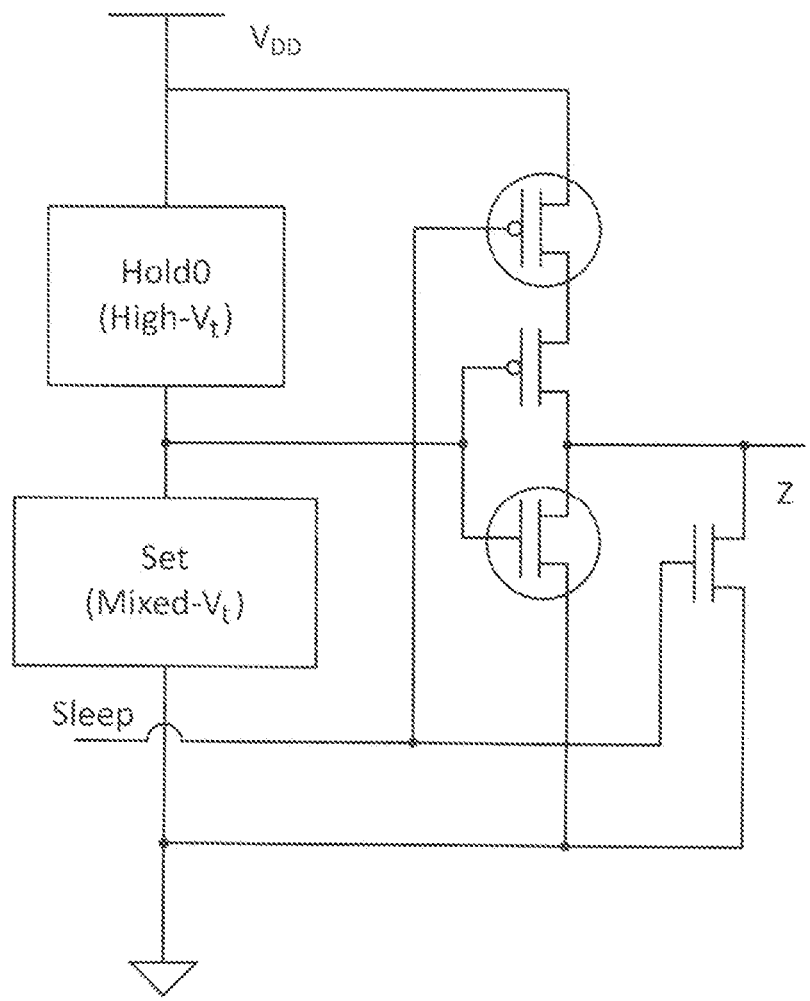
FIG. 2 is a MTNCL Gate General Diagram.

In order to reduce the area and power overhead in NCL circuits, MTNCL [11] was invented by implementing MTCMOS power-gating in NCL. MTNCL uses both Low-Vt (fast but leaky) and High-Vt (slow but less leaky) transistors and introduces a sleep function. The static gate implementation in FIG. 2 shows that the Hold0 logic block is all High-Vt transistors for smaller leakage. When the sleep signal is de-asserted, the Set logic block uses mostly Low-Vt transistors for faster switching speeds to assert a valid output. After a gate is asserted, it is de-asserted when the sleep signal is enabled, making sure every VDD-GND path has at least one High-Vt transistor that is turned off. MTNCL circuits therefore exhibit significant area reduction and power saving compared to NCL and synchronous counterparts, while maintaining the advantages of QDI asynchronous logic such as timing flexibility and robust operation against process/voltage/temperature variabilities. MTNCL uses the same 27 threshold gate library as NCL. An m is added to the end of each gate name indicating they are MTNCL gates.

Existing Synchronous Polymorphic Gates

Figure 3:
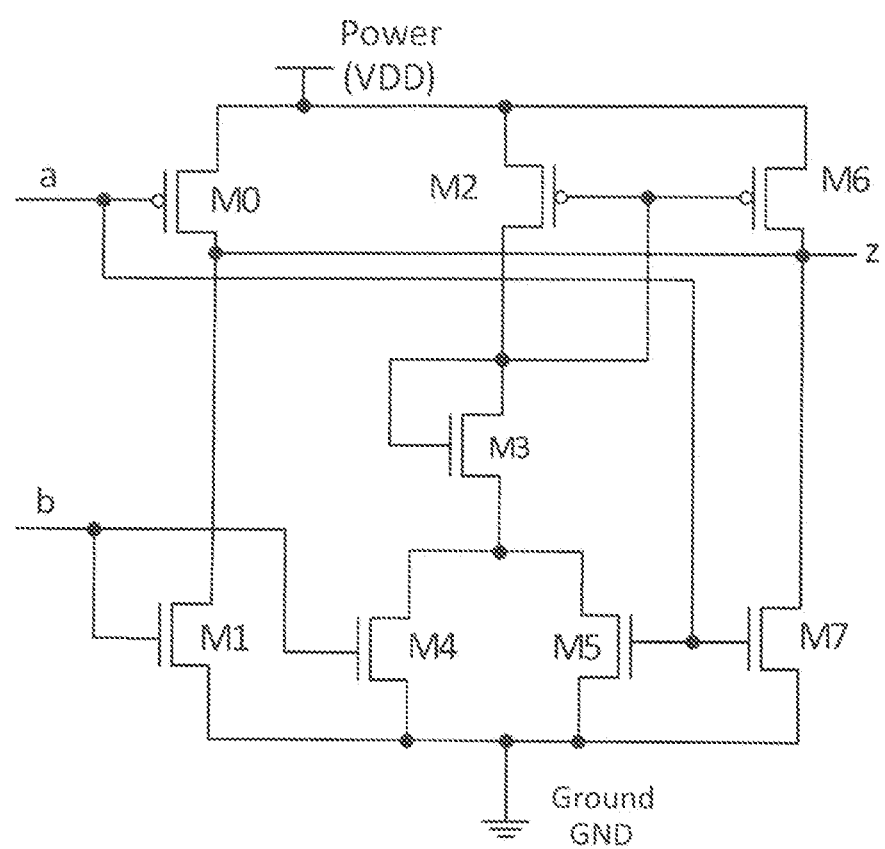
FIG. 3 is a Boolean NAND-NOR Polymorphic Gate Schematic.

Among the very few polymorphic gate published in literature, the most popular one is a Boolean NAND-NOR gate [9] designed in AMIS CMOS 0.7 µm (700 nm) technology. The gate schematic is shown in FIG. 3. The table below includes all cases of input pattern and the corresponding outputs for both NAND and NOR gate functions.

| Case | Input A | Input B | NAND Output | NOR Output |
|------|---------|---------|-------------|------------|
| 1 | 0 | 0 | 1 | 1 |
| 2 | 1 | 0 | 1 | 0 |
| 3 | 0 | 1 | 1 | 0 |
| 4 | 1 | 1 | 0 | 0 |

When inputs A and B have the same value (case 1 and case 4), transistors M0 and M1 produce the desired output. The output is the same for both the NAND and NOR functions. In Case 2, transistors M0, M1, and M4 are OFF. Transistors M5 and M7 are ON. The determining factor for the value at the output rests on the state of transistor M2, M3, and M6. Transistor M5 forms a path to GND that allows current to flow through transistor M3. Consider the case of low supply voltage (NOR case), a lower voltage at the source of transistor M2 means a reduced current through M2. Since M2 and M6 form a skewed current mirror, the amount of current that the strong transistor M6 can conduct is reduced. Thus, transistor M7 is able to overpower transistor M6 and a logic '0' is represented at the output. When the supply voltage is high, the higher voltage at the source of M2 means the current M2 is able to conduct is increased significantly, and this effect is greatly multiplied in the strong transistor M6. In this case, the strong pull to VDD from transistor M6 overpowers the weaker path to GND represented by transistor M7, and a logic '1' is represented at the output.

In Case 3, transistors M5 and M7 are OFF. Transistors M0, M1, and M4 are ON. Transistors M0 and M1 form a short circuit path from VDD to GND, and thus will pull the output to a nonzero voltage value lower than VDD. M1 is designed as much stronger than M0, so the value of the output is closer to GND. Again, the value of the output rests on the state of transistors M2, M3, and M6. Transistor M4 forms a path to GND that allows current to be drawn through transistor M3. When the supply voltage is low, the current drawn through transistor M2 is low, and thus the current through transistor M6 in the skewed current mirror is low. With M1 being a stronger pull to GND, the output is pulled to logic 0. When the supply voltage is high, the current drawn through transistor M2 is higher due to the high source voltage, and thus the current drawn through transistor M6 in the skewed current mirror is high. Any effect on the current of M2 is greatly magnified in strong transistor M6, and transistor M6 is able to overpower the pull to GND in transistor M1. Thus the output is pulled to logic 1.

Asynchronous Polymorphic MTNCL Gates

Figure 4:
FIG. 4 shows the NMOS Transistor Threshold Drop Effect.

In general, MTNCL gates are much more powerful than the Boolean gates because of their more complex logic expressions. The underlying principle for the design of polymorphic MTNCL gates, which is fundamentally different from that of the existing synchronous polymorphic gates, is the NMOS threshold drop effect. An NMOS transistor with its gate and drain connected to supply voltage (VDD) passes a degraded signal, with the voltage at the source of the transistor (Vs) dropped by (a maximum of) its threshold voltage (Vt). This is illustrated in FIG. 4. When the supply voltage is much greater than the threshold voltage, this degradation does not present an issue for circuit operation. Driving another NMOS transistor with the source of a pass transistor exhibiting threshold drop still allows the transistor to be completely turned on. However, if the supply voltage is close to the threshold voltage, the threshold drop causes the transistor to be only partially on, just like an active resistor. Leveraging this property, polymorphic MTNCL gates can be constructed such that the pull-down network is able to be gated by a threshold drop transistor. Two supply voltages are chosen such that the lower voltage will significantly weaken the undesirable portions of the pull-down network and cause the function of the polymorphic gate to change. When the higher supply voltage is applied, the threshold drop is not significant enough to weaken the pull-down network, and the other built-in function is in effect.

Figure 5:
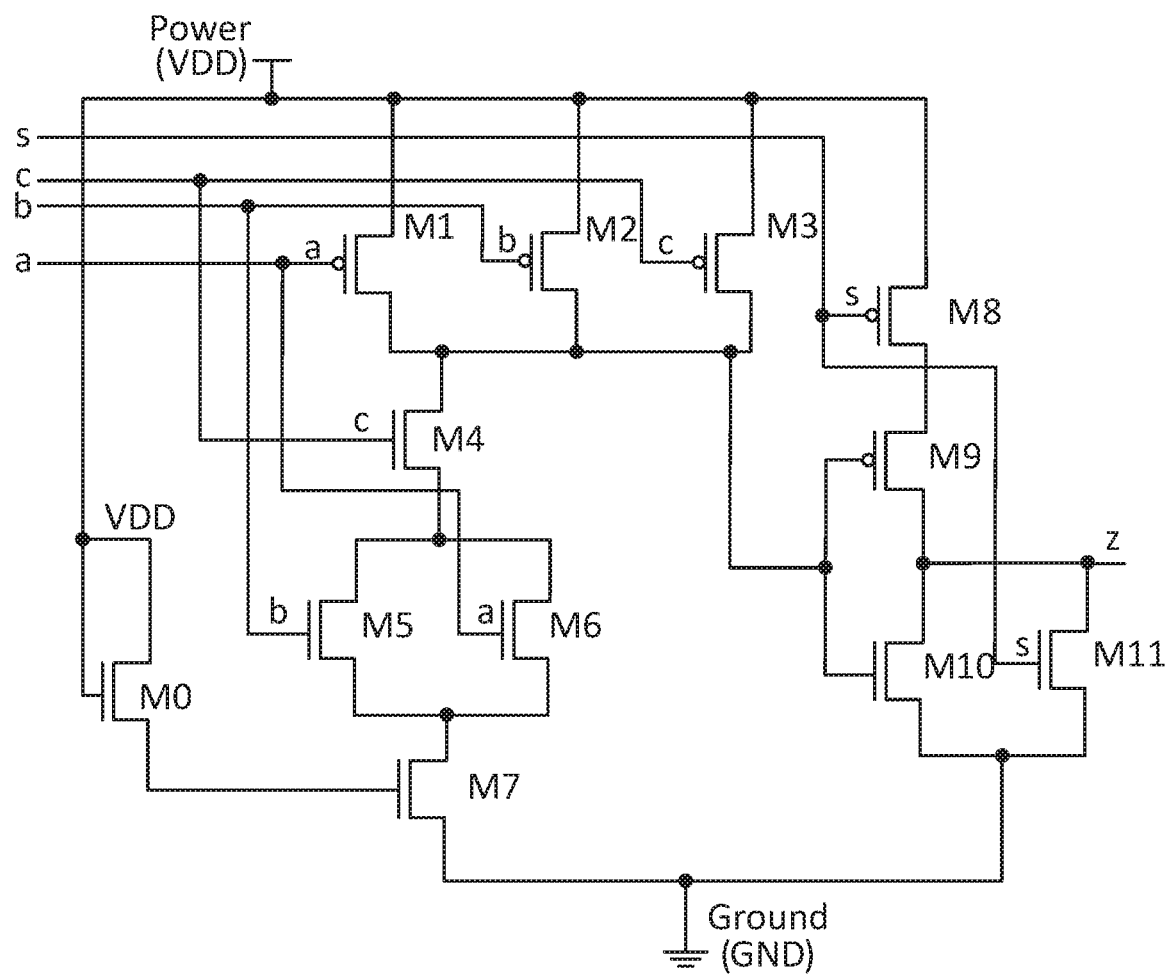
FIG. 5 shows a TH33m-TH33w2m Polymorphic Gate Schematic.

FIG. 5 shows a TH33m-TH33w2m polymorphic gate, performing the built-in functions of a TH33m MTNCL gate and a TH33w2m MTNCL gate. The naming convention used in MTNCL gates is that for a THxym gate, the parameter x denotes the number of inputs for the gate. The parameter y denotes to the gate's threshold, which is how many inputs must be asserted for the output to be asserted. A TH33m gate corresponds to the Boolean function ABC. A TH33w2m gate corresponds to the Boolean function AB+AC. This circuit is designed in the TSMC 90 nm process with a supply voltage of 1.2 V corresponding to the selection of the TH33w2m function and a supply voltage of 0.7 V corresponding to the selection of the TH33m function.

The pull-down network (NMOS Transistors) in this gate corresponds directly to the pull-down network of a TH33w2m gate. The pull-up network (PMOS Transistors) corresponds directly to the pull-up network of a TH33m gate. Transistors M0 and M7 correspond to the gating mechanism serving as a selective active resistor for the circuit. Transistor M0 is a pass transistor utilizing the threshold drop effect. The table below includes four representative cases of input pattern and the corresponding outputs for both TH33w2m and TH33m gate functions.

| Case | Input A | Input B | Input C | TH33w2m Output | TH33m Output |
|------|---------|---------|---------|----------------|--------------|
| 1 | 0 | 0 | 0 | 0 | 0 |
| 2 | 1 | 1 | 0 | 1 | 0 |
| 3 | 1 | 0 | 1 | 1 | 0 |
| 4 | 1 | 1 | 1 | 1 | 1 |

Since Case 1 and 4 cause the TH33m-TH33w2m polymorphic gate to output the same value, the analysis below focuses on Case 2 and 3. In Case 2, transistors M1 and M2 in the pull-up network (top half) are OFF. Transistor M3 is ON, and provides a strong path to POWER (VDD). In the pull-down network (bottom half), transistor M4 is OFF. Transistors M5 and M6 are ON. When VDD is set to the HIGH voltage (1.2 V), transistor M0 passes a relatively high voltage value to the gate of transistor M7. This effectively allows transistor M7 to be fully ON, creating a strong path to Ground (GND). The transistors are sized such that the drive strength of the pull-down network exceeds that of the pull-up network, so the output inverter (transistors M9 and M10) receives a low voltage signal. The inverter then rectifies this signal and inverts it to logic high, and the output is pulled to logic '1'. When VDD is set to the LOW voltage (0.7 V), transistor M7 is much more sensitive to any voltage reduction coming from transistor M0. Transistor M0 weakens the value of VDD it passes, and the effective resistance transistor M7 provides is increased. This reduces the strength of the path to GND, and allows the pull-up network to overpower the pull-down network and provide a high voltage to the output inverter (transistors M9 and M10). The inverter rectifies this signal and inverts it, creating a value of logic '0' at the output. This allows for the difference in function at different supply voltages. Transistors M8 and M11 are sleep transistors. When sleep is asserted, the output of the gate is immediately pulled to logic '0'.

In Case 3, transistors M1 and M3 in the pull-up network (top half) are OFF. Transistor M2 in the pull-up network is ON. The ON transistor M2 provides a strong path to VDD. In the pull-down network (bottom half), transistor M5 is OFF. Transistors M4 and M6 are ON. When VDD is set to the HIGH voltage (1.2 V), transistor M0 passes a relatively high voltage value to the gate of transistor M7. This effectively allows transistor M7 to be fully ON, creating a strong path for the output to Ground (GND). The transistors are sized such that the drive strength of the pull-down network exceeds that of the pull-up network, so the output inverter (transistors M9 and M10) receives a low voltage signal. The inverter then inverts this value to logic high, and the output is pulled to logic '1'. When VDD is set to the LOW voltage (0.7 V), transistor M7 is much more sensitive to any voltage reduction coming from transistor M0. Transistor M0 weakens the value of VDD it transmits, and the effective resistance transistor M7 provides is increased. This reduces the strength of the path to GND, and allows the pull-up network to overpower the pull-down network and transmit a high voltage to the output inverter (transistors M9 and M10). The inverter rectifies this signal and inverts it, creating a value of logic '0' at the output. This allows for the difference in function at different supply voltages. Transistors M8 and M11 are sleep transistors. When sleep is asserted, the output of the gate is immediately pulled to logic '0'.

Figure 6:
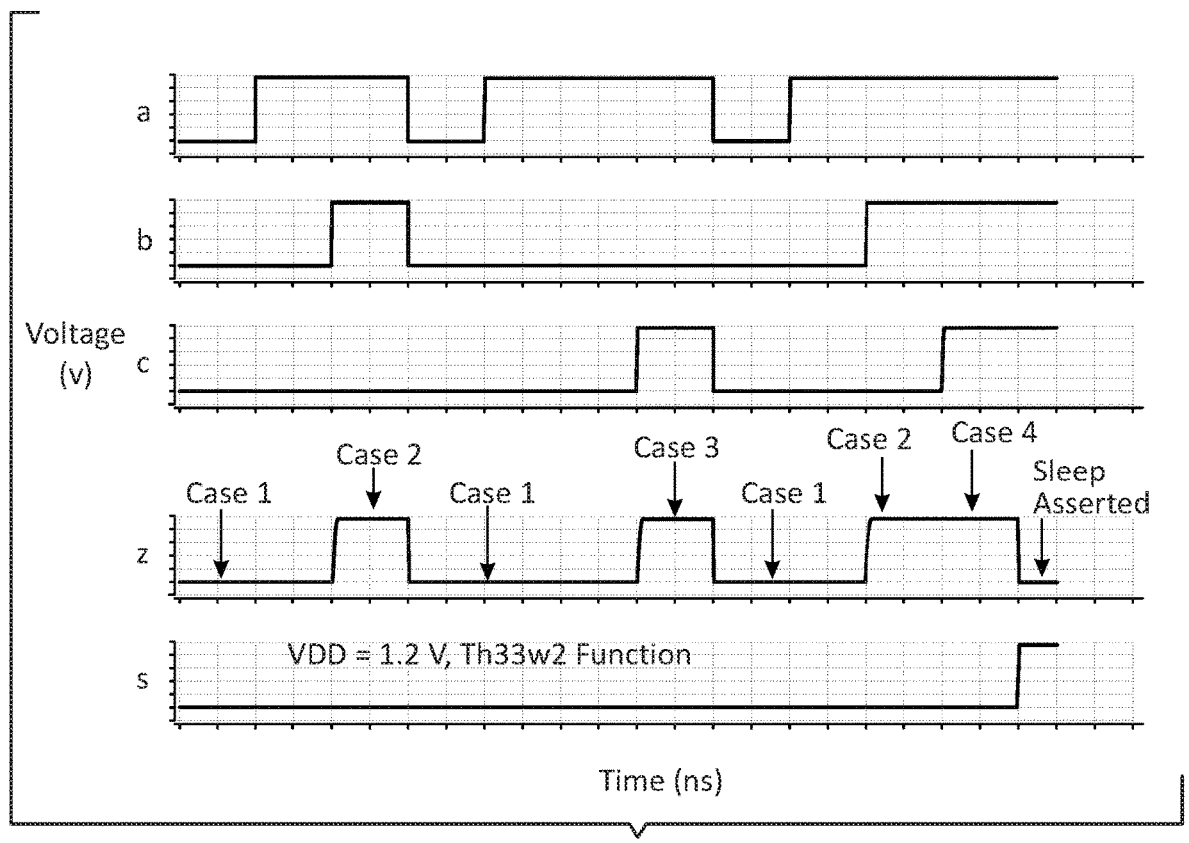
FIG. 6 shows a Waveform of TH33m-TH33w2m Polymorphic Gate at 1.2V VDD exhibiting TH33w2m Operation.
Figure 7:
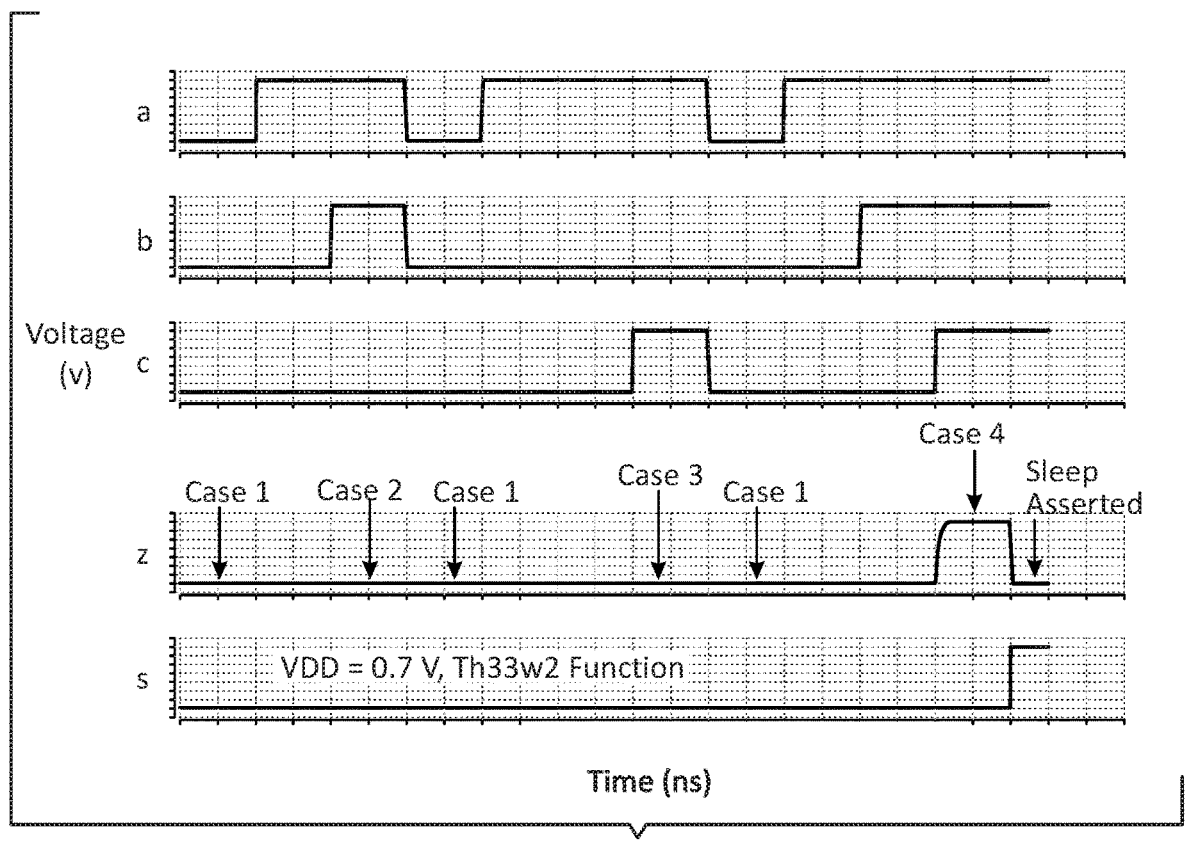
FIG. 7 shows a Waveform of TH33m-TH33w2m Polymorphic Gate at 0.7V VDD exhibiting TH33m Operation.

FIGS. 6 and 7 show the waveforms of operation for a supply voltage of 1.2 V and 0.7 V, respectively, across all cases.

This polymorphic MTNCL gate structure can be easily adopted to design all combinations of MTNCL gate functions. The area of each gate is much smaller compared to if both functions are standalone due to the sharing of transistors inside each gate. For example, the TH33m-TH33w2 polymorphic gate has 12 transistors, while a standalone TH33m gate has 10 transistors and a standalone TH33w2 gate also has 10 transistors. Therefore, the polymorphic gate has 40% transistor count reduction.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. An electrical circuit apparatus receiving a set of inputs and a circuit supply voltage controllable between a first supply voltage level and a second supply voltage level to generate an output, the electrical circuit apparatus comprising:
   a set of transistors exhibiting a first logic function at the output based on the set on inputs and the first supply voltage level; and
   a logic function modifier circuit activated by the second supply voltage level to modify the first logic function to a different second logic function at the output.

2. The electrical circuit apparatus of claim 1, further comprising:
   an N-type metal-oxide-semiconductor transistor with a gate, a drain, a source and a threshold voltage, the gate and the drain connected to the circuit supply voltage to provide voltage at the source dropped by the threshold voltage.

3. The electrical circuit apparatus of claim 2, further comprising:
   the set of transistors including a pull-up network; and
   the logic function modifier circuit including a pull-down network connected to the N-type metal-oxide-semiconductor transistor.

4. An electrical circuit apparatus receiving a set of logic inputs and a circuit supply voltage controllable between a first supply voltage level and a second supply voltage level to generate a logic output, the electrical circuit apparatus comprising:
   an N-type metal-oxide-semiconductor transistor with a gate, a drain, a source and a threshold voltage, the gate and the drain connected to the circuit supply voltage to provide voltage at the source dropped by the threshold voltage; and
   a logical signal function modification network connected to the source.

5. An asynchronous polymorphic circuit using a set of inputs including a sleep signal, a ground, and a circuit supply voltage controllable between a first supply voltage level and a second supply voltage level to generate an output, the asynchronous polymorphic circuit comprising:
   an asynchronous transistor circuit exhibiting a first logic function at the output based on the set of inputs and the first supply voltage level the output including output paths, each output path including at least one high voltage transistor;
   a signal modification network connected to the asynchronous transistor circuit to implement a second logic function at the output based on the set of inputs and the second supply voltage level, the second logic function different than the first logic function; and
   a sleep output signal circuit implementing a sleep signal at the output upon receipt of the sleep signal, the sleep signal turning off the at least one high voltage transistor in every output path.

6. An electric circuit comprising:
   a polymorphic multi-threshold NULL convention logic gate that exhibits one logic function under a higher supply voltage, and a different second logic function under a lower supply voltage.

7. An electrical circuit for receiving input signals, receiving a variable supply voltage including a first supply voltage and a second supply voltage, and generating an output function signal changing from a first function to a second different function, the circuit comprising:
   a transistor network electrically connected to the input signals to generate the output signal;
   the transistor network including a pass transistor electrically connected to the variable supply voltage creating a threshold drop effect to lower the variable supply voltage;
   a resistance transistor electrically connected to the lowered variable supply voltage from the pass transistor and also connected to the transistor network;
   the resistance transistor electrically coupled in the transistor network to change the output function signal from the first function to the different second function based on the variable supply voltage.

8. The electrical circuit of claim 7, wherein the first supply voltage is insufficient to activate the resistance transistor through the pass transistor, but the second supply voltage is sufficient to activate the resistance transistor.

* * * * *